(12) United States Patent
Wakabayashi (10) Patent No.: US 8,123,456 B2
(45) Date of Patent: Feb. 28, 2012

(54) CONTAINER CHANGING SYSTEM AND CONTAINER CHANGING METHOD

(75) Inventor: Shinji Wakabayashi, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 538 days.

(21) Appl. No.: 12/190,139

(22) Filed: Aug. 12, 2008

(65) Prior Publication Data

US 2009/0060697 A1    Mar. 5, 2009

Related U.S. Application Data

(60) Provisional application No. 60/983,283, filed on Oct. 29, 2007.

(30) Foreign Application Priority Data

Aug. 30, 2007  (JP) ................................ 2007-224014

(51) Int. Cl.
*B65G 47/90* (2006.01)
(52) U.S. Cl. ......... 414/626; 414/281; 414/814; 414/940
(58) Field of Classification Search .................. 414/626, 414/814, 940, 281
See application file for complete search history.

(56) References Cited

U.S. PATENT DOCUMENTS 6,572,321 B1 * 6/2003 Nulman ................... 414/416.05
(Continued)

FOREIGN PATENT DOCUMENTS

JP       2000-150622       5/2000

*Primary Examiner* — Scott Lowe
(74) *Attorney, Agent, or Firm* — Oblon, Spivak, McClelland, Maier & Neustadt, L.L.P.

(57) ABSTRACT

A container changing system able to prevent deterioration in the working rate of substrate processing apparatuses and deterioration in the amount of production of semiconductor devices. A second mounting portion is arranged between a carrier of a container conveying unit and a first mounting portion of a substrate processing apparatus with respect to a lifting direction of a container. The second mounting portion is configured to freely advance and withdraw to/from a lifting path of the container. A container lifting unit is arranged between the carrier and the second mounting portion with respect to the lifting direction. In the container lifting unit, a base portion is configured to freely advance and withdraw to/from the lifting path, a second holder is provided below the base portion and can hold the container, and a second lifter is arranged between the base portion and the second holder and configured to lift up/down the second holder between the base portion and the first mounting portion when the second holder is located opposed to the first mounting portion.

10 Claims, 8 Drawing Sheets

U.S. PATENT DOCUMENTS

| | | | |
|---|---|---|---|
| 6,579,052 B1* | 6/2003 | Bonora et al. | 414/222.01 |
| 6,726,429 B2* | 4/2004 | Sackett et al. | 414/217 |
| 6,889,813 B1* | 5/2005 | Trammell et al. | 198/346.3 |
| 7,413,396 B2* | 8/2008 | Ito | 414/626 |
| 7,753,639 B2* | 7/2010 | Hoshino | 414/282 |
| 2002/0146312 A1* | 10/2002 | Chokshi et al. | 414/803 |
| 2002/0182040 A1* | 12/2002 | Kimura et al. | 414/331.04 |
| 2003/0077153 A1* | 4/2003 | Elliott et al. | 414/281 |
| 2004/0047714 A1* | 3/2004 | Poli et al. | 414/281 |

* cited by examiner

CONTAINER CHANGING SYSTEM AND CONTAINER CHANGING METHOD

BACKGROUND OF THE INVENTION

1. Field of the Invention

The present invention relates to a container changing system and a container changing method, and more particularly, to a container changing system, which changes a container that accommodates substrates with a new container, in a substrate processing apparatus.

2. Description of the Related Art

In semiconductor device manufacturing factories, semiconductor wafers (hereinafter just referred to "wafer(s)") are conveyed between a plurality of substrate processing apparatuses in a clean room. The wafers, when conveyed, are accommodated in a container, such as a FOUP (front opening unified pod), for isolating the wafers from outside in order to prevent dust floating in the clean room from attaching to the wafers.

Figure 7:
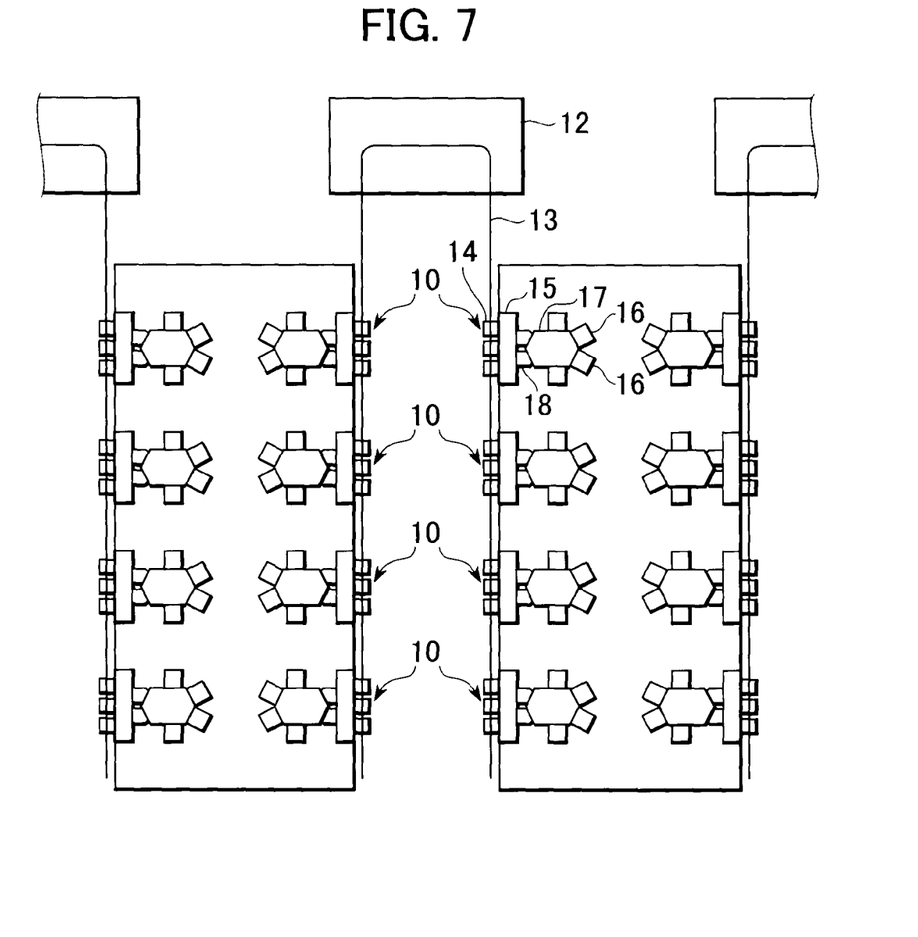
FIG. 7 is a plan view illustrating a situation of arranging substrate processing apparatuses in a clean room.

As shown in FIG. 7, a clean room is typically arranged with a plurality of substrate processing apparatuses 10, stockers 12 for stocking a plurality of FOUPs 11, which will be described later, and rails 13 which are disposed on a ceiling portion of the clean room to link the substrate processing apparatuses 10 and the stockers 12.

Each substrate processing apparatus 10 includes: a loader module 15 having FOUP stages 14 for mounting the FOUP 11 and transferring wafers which are not yet processed (hereinafter referred to "unprocessed wafers") out of the mounted FOUP 11 or transferring processed wafers into the FOUP 11; process modules 16 for subjecting wafers to plasma processing and the like; a transfer module 17 for transferring a wafer from/to each process module 16; and a load lock module 18 for transferring wafers between the transfer module 17 and loader module 15.

The rail 13 is laid above the FOUP stages 14 in each of the substrate processing apparatuses 10. A plurality of FOUP conveying units 19 (e.g., see Japanese Laid-Open Patent Publication (Kokai) No. 2000-150622), which will be described later, are arranged on the rail 13 to convey the FOUPs 11. Specifically, the FOUP 11 accommodating unprocessed wafers is conveyed out of the stocker 12 to the substrate processing apparatus 10, and the FOUP 11 accommodating processed wafers is conveyed from the substrate processing apparatus 10 into the stocker 12.

Figure 8A:
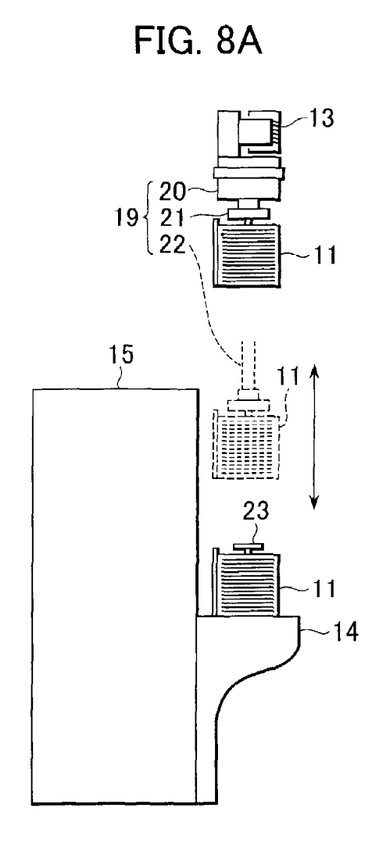
Figure 8B:
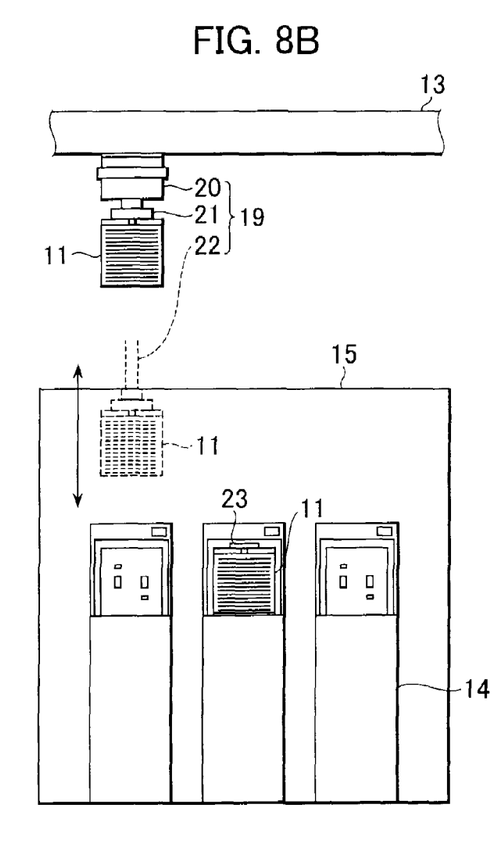

FIGS. 8A and 8B schematically illustrates the configuration and operation of a conventional FOUP conveying unit. FIG. 8A is an illustration as viewed from the side of a loader module, and FIG. 8B is an illustration as viewed from the front of the loader module.

In FIGS. 8A and 8B, the FOUP conveying unit 19 includes: a carrier (running body) 20 which is guided by the rail 13 and runs along the rail 13; a holder 21 which is provided below the carrier 20, with a hook being incorporated therein; and a belt 22 which couples the carrier 20 and the holder 21, and is retractable in a floor-ceiling direction in a clean room.

The FOUP 11 is a box-like container made of resin, which accommodates a plurality of, e.g. 25 wafers so as to be disposed parallel to each other. The FOUP 11, whose one side face is structured by a cover member that can be opened and closed, is provided with a portion 23 to be held (hereinafter referred to "holding portion 23") having a projected portion projected from a ceiling portion, which projected portion has a tip end formed into a tabular shape.

In the FOUP conveying unit 19, the holder 21 is able to hold the FOUP 11 by having the incorporated hook engaged with the holding portion 23 of the FOUP 11. Meanwhile, the belt 22 lifts up/down the holder 21 in the arrowed direction indicated in FIGS. 8A and 8B by having the belt 22 expanded and contracted. As a result, the FOUP 11 held by the holder 21 is lifted up/down between the carrier 20 and the FOUP stage 14. In conveying the FOUP 11, the FOUP conveying unit 19 contracts the belt 22 to lift up the FOUP 11, and moves in the state where the FOUP 11 is suspended.

In the case where the FOUP 11 accommodating processed wafers is changed with the FOUP 11 accommodating unprocessed wafers in the substrate processing apparatus 10, the (empty) FOUP conveying unit 19 without suspending the FOUP 11 first moves to the substrate processing apparatus 10, lifts up the FOUP 11 accommodating the processed wafers from the FOUP stage 14, and conveys the FOUP 11, in the state of being suspended, to the stocker 12. Then, the FOUP conveying unit 19 suspends the FOUP 11 accommodating unprocessed wafers from the stocker 12, and in this state, conveys the FOUP 11 to the substrate processing apparatus 10, and lifts down the FOUP 11 for mounting on the FOUP stage 14.

However, the substrate processing apparatus 10 and the stocker 12 are typically disposed being distanced from each other. For this reason, it takes time to convey the FOUP 11 between the substrate processing apparatus 10 and the stocker 12, using the FOUP conveying unit 19. In addition, the substrate processing apparatus 10 cannot process the wafers during the conveyance in which the FOUP conveying unit 19 conveys the FOUP 11 accommodating processed wafers from the substrate processing apparatus 10 to the stocker 12 and subsequently conveys the FOUP 11 accommodating unprocessed wafers from the stocker 12 to the substrate processing apparatus 10. As a result, working rate of the substrate processing apparatus 10 is deteriorated.

In order to enhance the working rate of the substrate processing apparatus 10 by omitting the conveyance of the FOUPs 11 between the substrate processing apparatus 10 and the stocker 12, a method has also been suggested, in which the number of the FOUP stages 14 of the substrate processing apparatus 10 is increased so that the substrate processing apparatus 10 can temporarily stock the FOUPs 11 accommodating processed wafers and the FOUPs 11 accommodating unprocessed wafers.

However, the FOUP conveying unit 19 is capable of mounting the FOUP 11 on the FOUP stage 14 only from above. Meanwhile, the increased FOUP stages 14 are required to be disposed in the horizontal direction with respect to other FOUP stages 14, which will increase the floor area (foot print) occupied by the substrate processing apparatus 10. As a result, the number of the substrate processing apparatuses 10 that can be arranged in the clean room is decreased to decrease the amount of production of the semiconductor devices.

There is a strong tendency, in the future, that semiconductor devices tend to be increased in the types and decreased in the amount of production for each type. Accordingly, the number of changes of the FOUPs 11 in each substrate processing apparatus 10 is expected to be increased. For this reason, the problems described above may become more apparent.

SUMMARY OF THE INVENTION

The present inventions provides a container changing system and a container changing method, which is able to prevent deterioration in the working rate of substrate processing apparatuses and deterioration in the amount of production of semiconductor devices.

Accordingly, in a first aspect of the present invention, there is provided a container changing system comprising a substrate processing apparatus having a first mounting portion on which a container configured to accommodate substrates can be mounted, and a container conveying unit which is disposed above the substrate processing apparatus and configured to convey the container, wherein the container conveying unit comprises a carrier configured to run along a rail laid above the first mounting portion, a first holder provided below the carrier and can hold the container, and a first lifter arranged between the carrier and the first holder, and lifts up/down the first holder between the carrier and the first mounting portion, when the first holder is located opposed to the first mounting portion, the container changing system comprising a second mounting portion arranged between the carrier and the first mounting portion with respect to a lifting direction of the container held by the first holder which is lifted up/down by the first lifter, configured to freely advance and withdraw to/from a lifting path of the container, and on which the container can be mounted, and a container lifting unit arranged between the carrier and the second mounting portion with respect to the lifting direction, wherein the container lifting unit comprises a base portion configured to freely advance and withdraw to/from the lifting path, a second holder provided below the base portion and can hold the container, and a second lifter arranged between the base portion and the second holder, and configured to lift up/down the second holder between the base portion and the first mounting portion when the second holder is located opposed to the first mounting portion.

According to the first aspect of the present invention, the second mounting portion is arranged between the carrier of the container conveying unit and the first mounting portion of the substrate processing apparatus, with respect to the lifting direction of the container held by the first holder which is lifted up/down by the first lifter of the container conveying unit. The second mounting portion can freely advance and withdraw to/from the lifting path. The container lifting unit is arranged between the carrier and the second mounting portion with respect to the lifting direction of the container. In the container lifting unit: the base portion can freely advance and withdraw to/from the lifting path; the second holder provided below the base portion can hold the container; and, between the base portion and the first mounting portion, the second lifter arranged between the base portion and the second holder can lift up/down the second holder when the second holder is located opposed to the first mounting portion.

Thus, in changing a first container held by the first holder with a second container mounted on the first mounting portion, the first container can be mounted on the second mounting portion, and the second mounting portion can be withdrawn from the lifting path of the container, so that only the second container can be present in the lifting path. Accordingly, the second container can be held by the first holder, and the first holder can be lifted up, so that the second container can be removed from the first mounting portion. Further, the container lifting unit can mount the first container mounted on the second mounting portion on the first mounting portion.

Further, the second container can be mounted on the second mounting portion by the container lifting unit, and then the second mounting portion can be permitted to withdraw from the lifting path, so that only the first container can be present in the lifting path. Thus, the first container can be mounted on the first mounting portion by lifting down the first holder. Also, the second container can be removed from the second mounting portion by permitting the second mounting portion to advance and stand in the lifting path, permitting the first holder to hold the second container, and permitting the first holder to be lifted up.

Specifically, the containers can be changed in the substrate processing apparatus without having the container conveying unit conveyed the containers between the substrate processing apparatus and the stocker. As a result, deterioration in the working rate of the substrate processing apparatus can be prevented. Also, since deterioration in the working rate of the substrate processing apparatus can be prevented without increasing the number of the first mounting portions, it is not necessary to decrease the number of the substrate processing apparatuses that can be arranged in the clean room. As a result, the amount of production of semiconductor devices can be prevented from being reduced.

The first aspect of the present invention can provide a container changing system, wherein the system further comprises a third mounting portion on which the container can be mounted, the third mounting portion being arranged between the second mounting portion and the container lifting unit with respect to the lifting direction, and configured to freely advance and withdraw to/from the lifting path.

According to the first aspect of the present invention, the third mounting portion on which a container can be mounted is also provided. The third mounting portion is arranged between the second mounting portion and the container lifting unit, with respect to the lifting direction, and is able to freely advance and withdraw to/from the lifting path. Thus, containers can be stocked in the vicinity of the first mounting portion by mounting the containers on the third mounting portion and permitting the third mounting portion to withdraw from the lifting path. As a result, variation of the container changing method in the substrate processing apparatus can be increased. In this way, the containers can be changed in an efficient manner.

Accordingly, in a second aspect of the present invention, there is provided a container changing method comprising, changing a first container held by the first holder with a second container mounted on the first mounting portion, in the container changing system described above, wherein the method comprises a first advancing step of permitting the second mounting portion to advance and stand in the lifting path, when the first holder is located opposed to the first mounting portion, a first mounting step of permitting the first lifter to lift down the first holder to mount the first container on the second mounting portion that has advanced and stood in the lifting path, a first withdrawal step of permitting the second mounting portion mounting the first container thereon to withdraw from the lifting path, a first holding step of permitting the first lifter to further lift down the first holder, and permitting the first holder that has been lifted down to hold the second container mounted on the first mounting portion, a second advancing step of permitting the second mounting portion to advance and stand in the lifting path, after permitting the first lifter to lift the first holder up to the carrier, a second holding step of permitting the base portion to advance and stand in the lifting path, permitting the second lifter to lift down the second holder, and permitting the second holder that has been lifted down to hold the first container mounted on the second mounting portion, a second withdrawal step of permitting the second mounting portion to withdraw from the lifting path, after permitting the second lifter to lift the first container held by the second holder up to a position causing no interference with a withdrawal path of the second mounting portion, and a second mounting step of permitting the second lifter to lift down the second holder, and permitting the second holder that has been lifted down to mount the first container on the first mounting portion.

According to the second aspect of the present invention, the first container held by the first holder can be changed with the second container mounted on the first mounting portion, without having the container conveying unit conveyed the containers between the substrate processing apparatus and the stocker. As a result, deterioration in the working rate of the substrate processing apparatus can be prevented. Also, since deterioration in the working rate of the substrate processing apparatus can be prevented without increasing the number of the first mounting portions, it is not necessary to decrease the number of the substrate processing apparatuses that can be arranged in the clean room. As a result, the amount of production of semiconductor devices can be prevented from being reduced. Further, the first container can be mounted on the second mounting portion, prior to the removal of the second container mounted on the first mounting portion. Thus, container change can be started even when the processing of the substrates to be accommodated in the second container has not been completed. In this way, the containers can be changed in an efficient manner.

Accordingly, in a third aspect of the present invention, there is provided a container changing method comprising, changing a first container held by the first holder with a second container mounted on the first mounting portion, in the container changing system described above, wherein the method comprises a first holding step of permitting the base portion to advance and stand in the lifting path, permitting the second lifter to lift down the second holder, and permitting the second holder that has been lifted down to hold the second container mounted on the first mounting portion, a first advancing step of permitting the second mounting portion to advance and stand in the lifting path, after permitting the second lifter to lift a second container held by the second holder up to a position causing no interference with a withdrawal path of the second mounting portion, a first mounting step of permitting the second lifter to lift down the second holder to mount the second container on the second mounting portion that has advanced and stood in the lifting path, a first withdrawal step of permitting the second mounting portion mounting the second container thereon to withdraw from the lifting path, a second mounting step of permitting the first lifter to lift down the first holder to mount the first container on the first mounting portion when the first holder is located opposed to the first mounting portion, a second advancing step of permitting the second mounting portion to advance and stand in the lifting path, after permitting the first lifter to lift the first holder up to the carrier, a second holding step of permitting the first lifter to lift down the first holder, and permitting the first holder that has been lifted down to hold the second container mounted on the second mounting portion, and a second withdrawal step of permitting the first lifter to lift the first holder up to the carrier, and permitting the second mounting portion to withdraw from the lifting path.

According to the third aspect of the present invention, the first container held by the first holder can be changed with the second container mounted on the first mounting portion, without having the container conveying unit conveyed the containers between the substrate processing apparatus and the stocker. As a result, deterioration in the working rate of the substrate processing apparatus can be prevented. Also, since deterioration in the working rate of the substrate processing apparatus can be prevented without increasing the number of the first mounting portions, it is not necessary to decrease the number of the substrate processing apparatuses that can be arranged in the clean room. As a result, the amount of production of semiconductor devices can be prevented from being reduced. Further, the second container can be mounted on the second mounting portion, prior to mounting the first container on the first mounting portion. Thus, container change can be started even when the first holder is not located opposed to the first mounting portion, or even when the container conveying unit has not been moved above the substrate processing apparatus. In this way, the containers can be changed in an efficient manner.

The features and advantages of the invention will become more apparent from the following detailed description taken in conjunction with the accompanying drawings.

BRIEF DESCRIPTION OF THE DRAWINGS

FIGS. 1A and 1B are schematic diagrams each illustrating the configuration of a container changing system, according to an embodiment of the present invention, in which FIG. 1A is an illustration as viewed from the side of a loader module of a substrate processing apparatus, and FIG. 1B is an illustration as viewed from the front of the loader module.

FIGS. 6A and 6B are schematic diagrams each illustrating the configuration of a container changing system, which changes BOPs as containers, in which FIG. 6A is an illustration as viewed from the side of a loader module of a substrate processing apparatus, and FIG. 6B is an illustration as viewed from the front of the loader module.

FIGS. 8A and 8B are schematic diagrams each illustrating the configuration and operation of a conventional FOUP conveying unit, in which FIG. 8A is an illustration as viewed from the side of a loader module, and FIG. 8B is an illustration as viewed from the front of the loader module.

DETAILED DESCRIPTION OF THE PREFERRED EMBODIMENTS

With reference to the drawings, hereinafter will be described some embodiments of the present invention.

A description will be given first on a container changing system according to the present embodiment of the present invention hereinbelow.

Figure 1A:
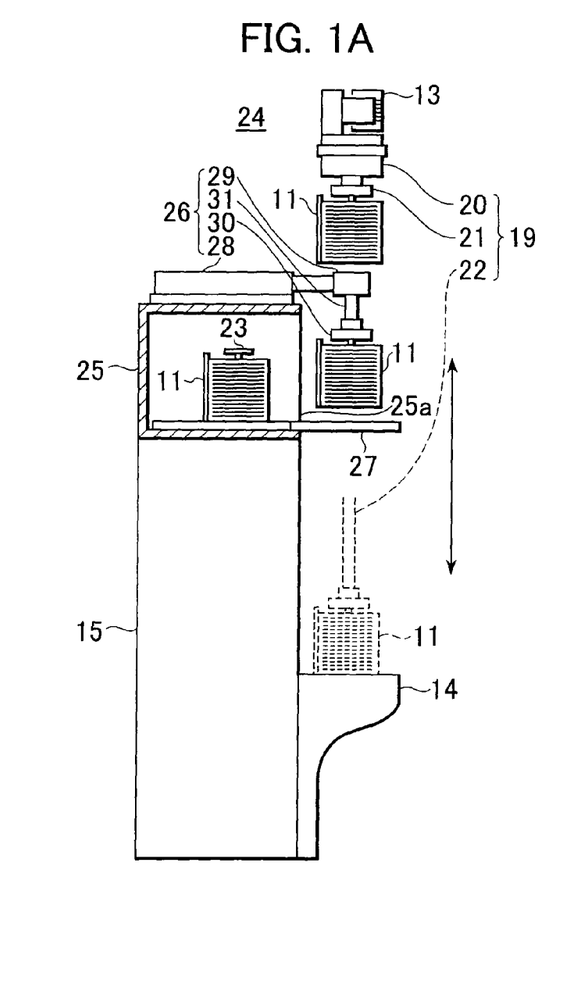
Figure 1B:
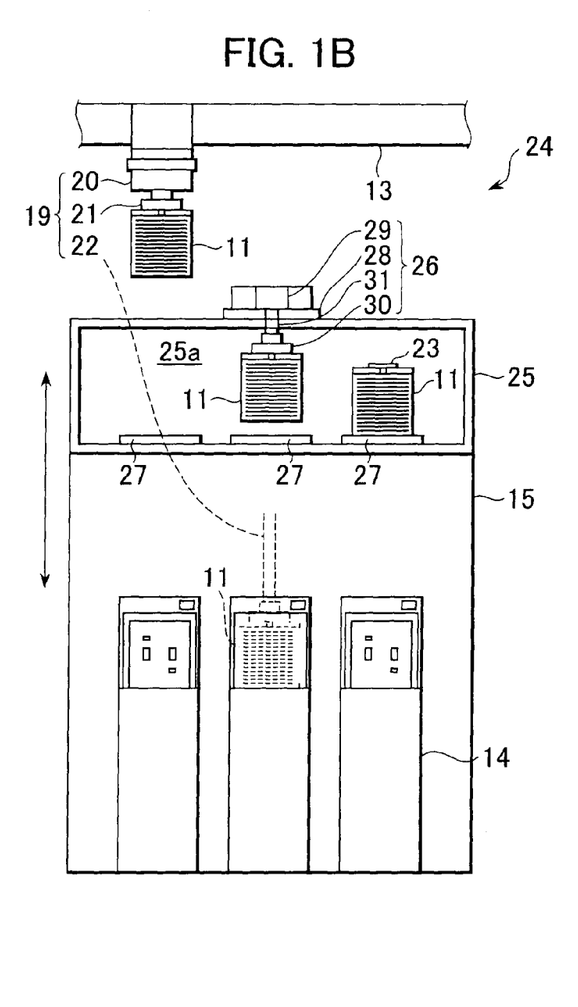

FIGS. 1A and 1B are schematic diagrams each illustrating the configuration of the container changing system, according to the embodiment of the present invention, in which FIG. 1A is an illustration as viewed from the side of a loader module of a substrate processing apparatus, and FIG. 1B is an illustration as viewed from the front of the loader module. It should be appreciated that, for the sake of convenience for explanation, the components, other than a loader module 15, of the substrate processing apparatus 10 are not shown in the figures, and that, for clear understanding, a buffer 25 that will be described later is shown by cross section in FIG. 1A.

In FIGS. 1A and 1B, a container changing system 24: the buffer 25 having a box-like shape, which is arranged on the loader module 15 and is able to accommodate FOUPs 11 (containers) therein; and a hoist 26 (container lifting unit) arranged on the buffer 25; as well as the substrate processing apparatus 10 and the FOUP conveying unit 19 described above. The buffer 25 is disposed between the carrier 20 of the FOUP conveying unit 19 and the FOUP stage 14 (first mounting portion) of the loader module 15, with respect to the lifting direction of the FOUP 11 (hereinafter after just referred to "lifting direction") which is lifted up/down by the FOUP conveying unit 19.

The FOUP 11 is hold by a holder 21 (first holder) which is lifted up/down in the arrowed direction indicated in the figures, by a belt 22 (first lifter). The buffer 25 is disposed on the loader module 15, so as not to interfere with the lifting path of the FOUP 11 (hereinafter just referred to a "lifting path"). The buffer 25 includes: an opening portion 25a which is open in a side face opposed to the lifting path; and a plate-like mounting board 27 (second mounting portion) which is arranged in the buffer 25 and configured to freely advance and withdraw to/from the lifting path.

The hoist 26 includes: a main body 28 which is movable in the arrangement direction of the FOUP stages 14 (the longitudinal direction of the loader module 15 or the buffer 25: the left-right direction in FIG. 1B) on the top surface of the buffer 25; a rod-like arm 29 (base portion) which is projected from the main body 28 and configured to freely advance and withdraw to/from the lifting path; a holder 30 (second holder) which is provided below the tip end portion of the arm 29, being incorporated with a hook; and a belt 31 (second lifter) which links the arm 29 and the holder 30 and is retractable in the lifting direction.

In the hoist 26, the holder 30 is able to hold the FOUP 11 by having the incorporated hook engaged with the holding portion 23 of the FOUP 11. Specifically, the tip end portion of the arm 29 advances to and stands in the lifting path to locate the holder 30 opposed to the FOUP stage 14, when the belt 31 is expanded/contracted in the lifting direction to lift up/down the holder 30. As a result, the FOUP 11 held by the holder 30 can be lifted up/down between the arm 29 and the FOUP stage 14. The hoist 26 is disposed between the carrier 20 of the FOUP conveying unit 19 and the mounting board 27, with respect to the lifting direction.

The container changing system 24 is so configured that the substrate processing apparatus 10 and the FOUP conveying unit 19 can communicate with each other. Specifically, prior to supplying the FOUP 11 conveyed by the FOUP conveying unit 19 to the substrate processing apparatus 10, communication is made between the substrate processing apparatus 10 and the FOUP conveying unit 19 as to whether or not the FOUP 11 is to be accommodated in the buffer 25 or on the FOUP stage 14.

Hereinafter is described a container changing method according to the present embodiment. The container changing method corresponds to: a method for firstly mounting a FOUP 11a accommodating unprocessed wafers (hereinafter referred to "unprocessed wafer FOUP 11a") on the mounting board 27 (hereinafter referred to a "first FOUP changing method"); and a method for firstly removing a FOUP 11b accommodating processed wafers (hereinafter referred to "processed wafer FOUP 11b") from the FOUP stage 14 (hereinafter referred to a "second FOUP changing method").

An explanation will be given first on the first FOUP changing method hereinbelow.

FIGS. 2A to 2D and FIGS. 3A to 3C are process diagrams illustrating the first FOUP changing method as the container changing method according to the present embodiment.

First, the FOUP conveying unit 19 conveys the unprocessed wafer FOUP 11a to the substrate processing apparatus 10, while moving along the rail 13, so that the holder 21 holding the unprocessed wafer FOUP 11a can be located opposed to the FOUP stage 14 for mounting the processed wafer FOUP 11b (FIG. 2A) thereon. In this case, the hoist 26 has been moved in the longitudinal direction of the buffer 25 so that the arm 29 or the like will not advance and stand in the lifting path.

Figure 2A:
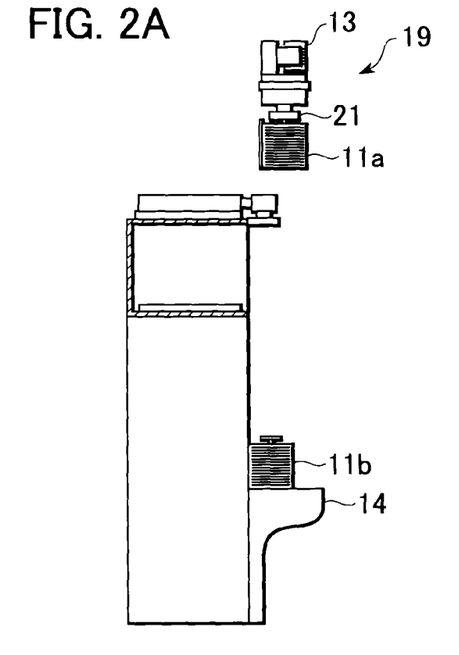
FIGS. 2A to 2D are process diagrams illustrating a first FOUP changing method as a container changing method, according to the present embodiment.
Figure 2B:
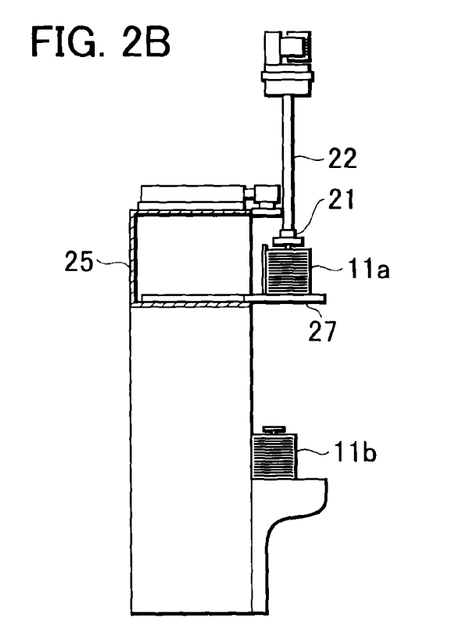

Then, the mounting board 27 of the buffer 25 advances and stands in the lifting path (first advancing step). After that, the belt 22 lifts down the holder 21 to mount the unprocessed wafer FOUP 11a on the mounting board 27 that has advanced and stood in the lifting path (first mounting step) (FIG. 2B). The holder 21 is then emptied.

Figure 2C:
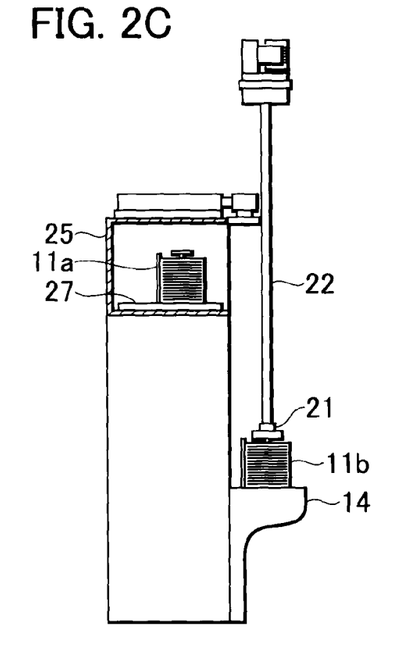

Subsequently, the mounting board 27 mounting the unprocessed wafer FOUP 11a thereon is withdrawn from the lifting path to accommodate the unprocessed wafer FOUP 11a in the buffer 25 (first withdrawal step). As a result, only the processed wafer FOUP 11b is present in the lifting path. Then, the belt 22 further lifts down the empty holder 21, so that the holder 21 that has been lifted down can hold the processed wafer FOUP 11b mounted on the FOUP stage 14 (first holding step) (FIG. 2C).

Then, the belt 22 lifts the holder 21 up to the carrier 20 to thereby remove the processed wafer FOUP 11b from the FOUP stage 14 and pull up the processed wafer FOUP 11b higher than the hoist 26. After that, the mounting board 27 again advances and stands in the lifting path to have the unprocessed wafer FOUP 11a advanced and stood in the lifting path (second advancing step). Then, the hoist 26 moves in the longitudinal direction of the buffer 25 so that the tip end portion of the arm 29 can advance and stand in the lifting path, and permits the arm 29 to expand. In this way, the arm 29 and the holder 30 can reliably advance and stand in the lifting path.

Figure 2D:
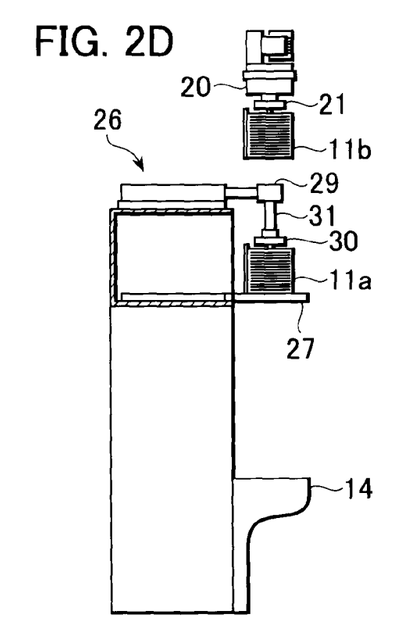

Further, after the tip end portion of the arm 29 has advanced and stood in the lifting paths the belt 31 lifts down the holder 30. The holder 30 that has been lifted down then holds the unprocessed wafer FOUP 11a mounted on the mounting board 27 (second holding step) (FIG. 2I).

Figure 3A:
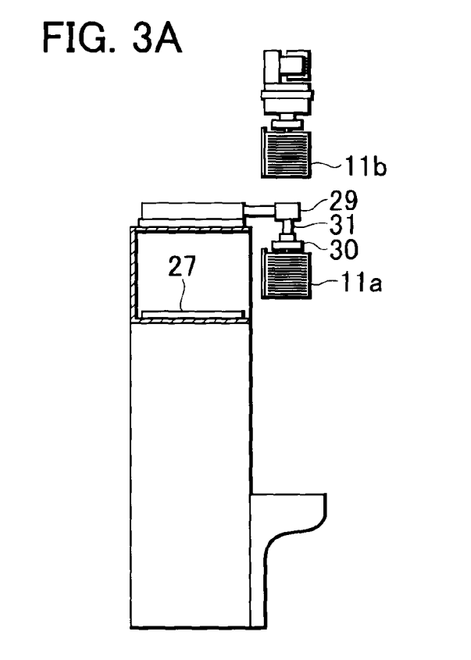
FIGS. 3A to 3C are process diagrams illustrating the first FOUP changing method as a container changing method, according to the present embodiment.

Then, the belt 31 lifts the unprocessed wafer FOUP 11a held by the holder 30 up to a position that would not interfere with the withdrawal path of the mounting board 27 to remove the unprocessed wafer FOUP 11a from the mounting board 27, followed by withdrawal of the mounting board 27 from the lifting path (second withdrawal step) (FIG. 3A). In this case, the unprocessed wafer FOUP 11a may just be apart from the mounting board 27. This may minimize the amount of lifting of the unprocessed wafer FOUP 11a, whereby changing time of the FOUPs can be reliably shortened.

Figure 3B:
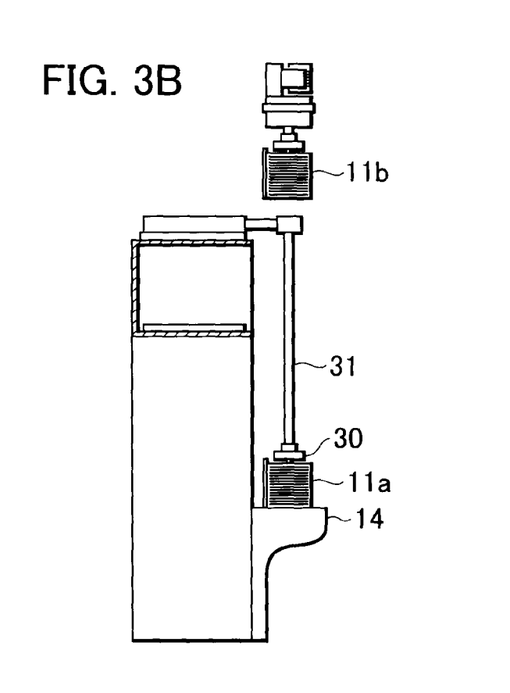
Figure 3C:
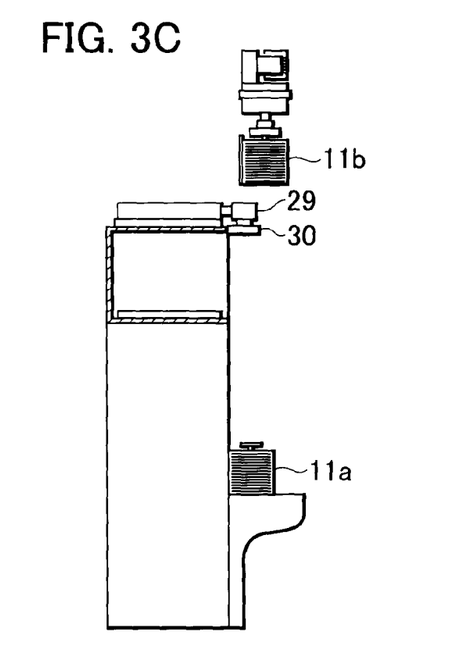

Then, the belt 31 lifts down the holder 30 which, in turn, mounts the unprocessed wafer FOUP 11a on the FOUP stage 14 (second mounting step) (FIG. 3B). Thus, the holder 30 is emptied.

After that, the belt 31 lifts the empty holder 30 up to the arm 29. The arm 29 then is withdrawn from the lifting path (FIG. 3C) to end the present process.

Hereinafter, an explanation will be given on the second FOUP changing method.

FIGS. 4A to 4D and FIGS. 5A to 5D are process diagrams illustrating the second FOUP changing method as the container changing method according to the present embodiment.

Figure 4A:
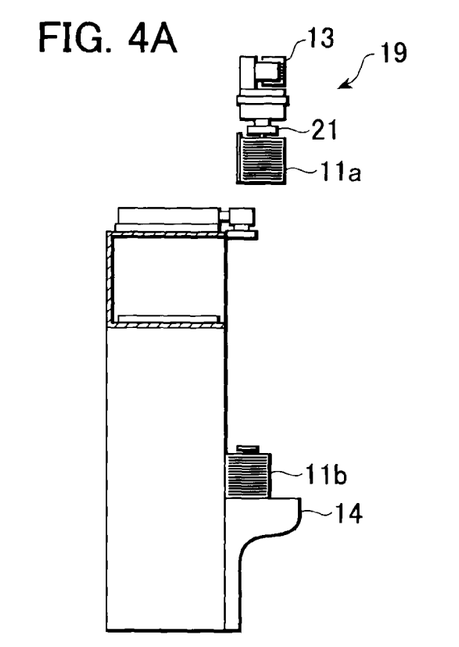
FIGS. 4A to 4D are process diagrams illustrating a second FOUP changing method as a container changing method, according to the present embodiment.

First, the FOUP conveying unit 19 conveys the unprocessed wafer FOUP 11a to the substrate processing apparatus 10, while moving along the rail 13, so that the holder 21 holding the unprocessed wafer FOUP 11a can be located opposed to the FOUP stage 14 mounting the processed wafer FOUP 11b thereon (FIG. 4A).

Figure 4B:
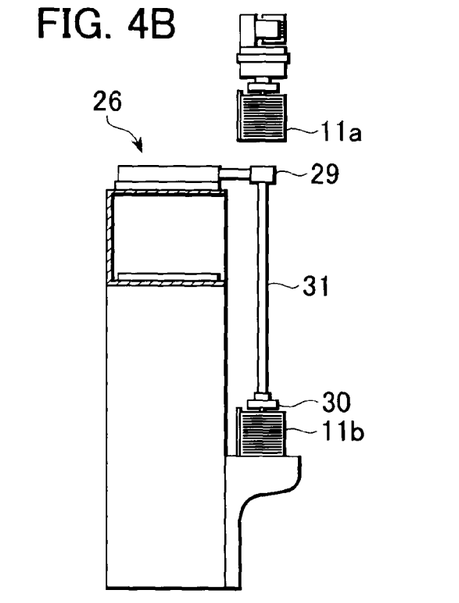

Then, the hoist 26 moves in the longitudinal direction of the buffer 25 so that the tip end portion of the arm 29 can advance and stand in the lifting path, and then expands the arm 29. Thus, the tip end portion of the arm 29 and the holder 30 can reliably advance and stand in the lifting path. After that, the belt 31 lifts down the empty holder 30. The holder 30 that has been lifted down then holds the processed wafer FOUP 11b mounted on the FOUP stage 14 (first holding step) (FIG. 4B).

Figure 4C:
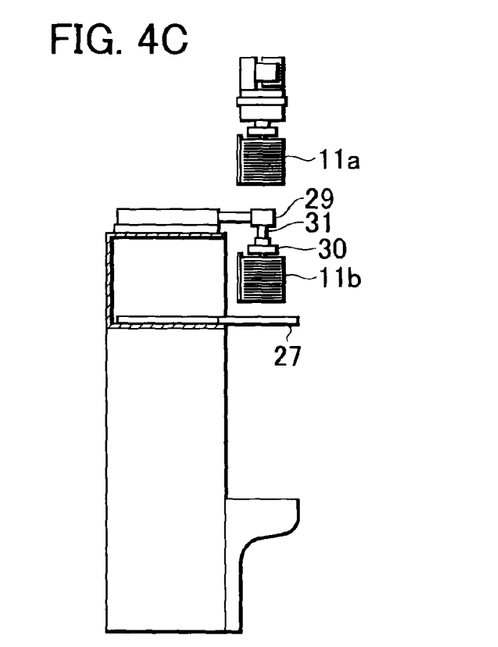

Then, the belt 31 lifts the processed wafer FOUP 11b held by the holder 30 up to a position that would not interfere with the withdrawal path of the mounting board 27. After that, the mounting board 27 advances and stands in the lifting path (first advancing step) (FIG. 4C). In this case, the processed wafer FOUP 11b may only be pulled up slightly higher than the mounting board 27. Thus, the amount of lifting up the processed wafer FOUP 11b can be minimized, whereby the changing time of FOUPs can be reliably shortened.

Figure 4D:
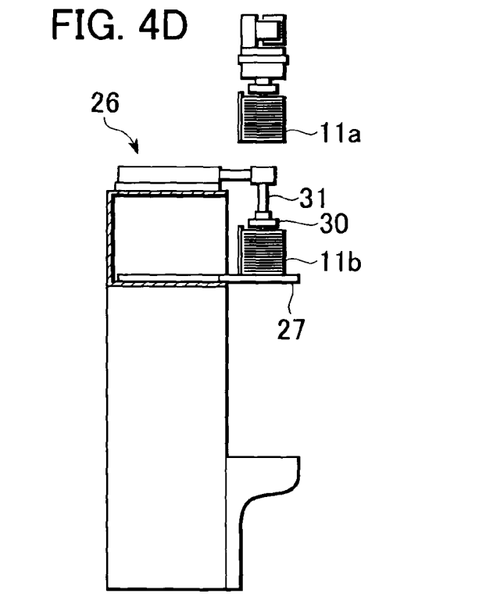

Then, the belt 31 lifts down the holder 30 to mount the processed wafer FOUP 11b on the mounting board 27 that has advanced and stood in the lifting path (first mounting step) (FIG. 4D). The holder 30 is thus emptied. Then, the belt 31 lifts the empty holder 30 up to the arm 29, and then the hoist 26 moves in the longitudinal direction of the buffer 25 so that the arm 29 or the like will not advance and stand in the lifting path.

Figure 5A:
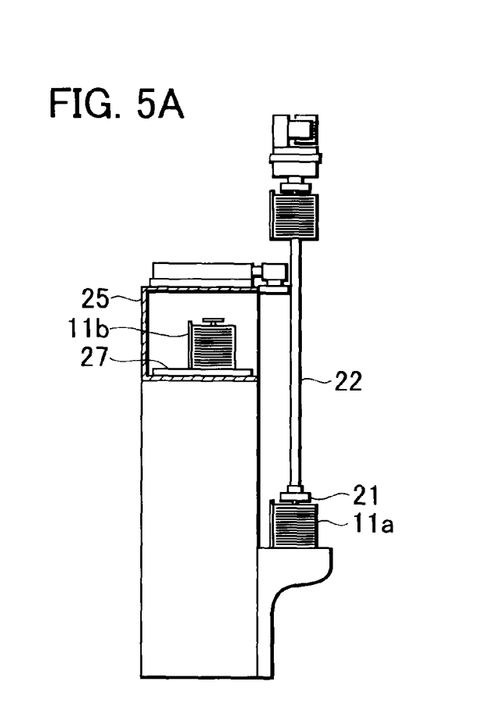
FIGS. 5A to 5D are process diagrams illustrating the second FOUP changing method as a container changing method, according to the present embodiment.

Then, the mounting board 27 mounting the processed wafer FOUP 11b thereon withdraws from the lifting path to accommodate the processed wafer FOUP 11b in the buffer 25 (first withdrawal step). As a result, only the unprocessed wafer FOUP 11a is present in the lifting path. Then, the belt 22 lifts down the holder 21 to mount the unprocessed wafer FOUP 11a on the FOUP stage 14 (second mounting step) (FIG. 5A). The holder 21 is thus emptied.

Figure 5B:
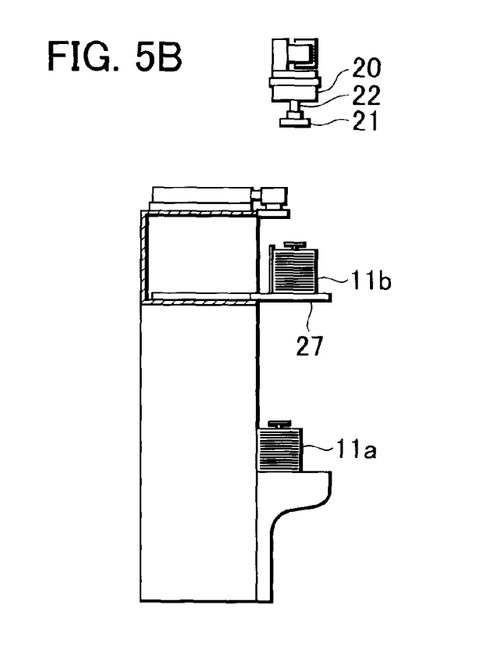

Then, after the belt 22 has lifted the empty holder 21 up to the carrier 20, the mounting board 27 again advances and stands in the lifting path to have the processed wafer FOUP 11b advanced and stood in the lifting path (second advancing step) (FIG. 5B).

Figure 5C:
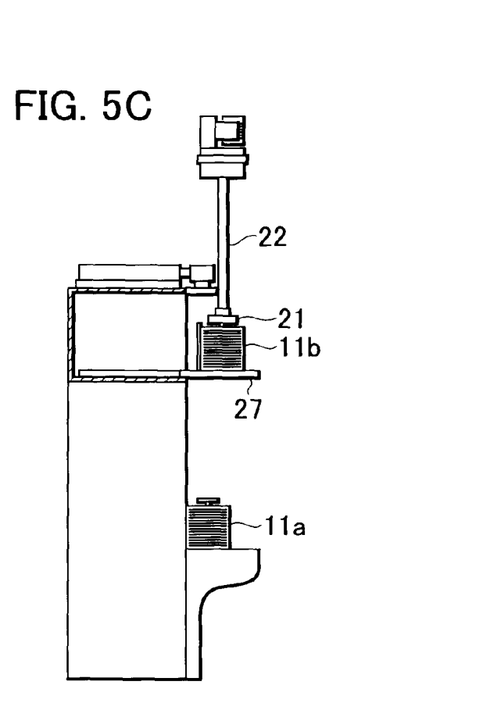
Figure 5D:
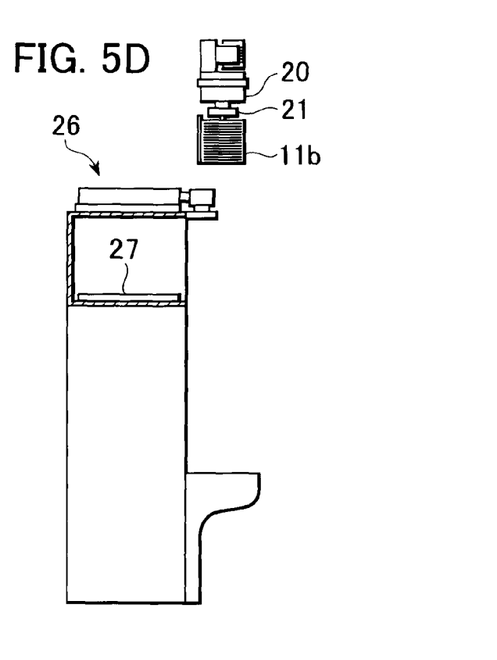

Then, the belt 22 lifts down the empty holder 21. The holder 21 that has been lifted down then holds the processed wafer FOUP 11b mounted on the mounting board 27 (second holding step) (FIG. 5C).

Then, the belt 22 lifts the holder 21 up to the carrier 20 to thereby remove the processed wafer FOUP 11b from the mounting board 27 and pull up the processed wafer FOUP 11b higher than the hoist 26. Then, the mounting board 27 withdraws from the lifting path (second withdrawal step) (FIG. 5D) to end the present process.

According to the container changing system 24 of the present embodiment, the mounting board 27 of the buffer 25, which is arranged between the carrier 20 and the FOUP stage 14 with respect to the lifting direction, can freely advance and withdraw to/from the lifting path. Also, in the hoist 26 arranged between the carrier 20 and the mounting board 27 with respect to the lifting direction, the arm 29 can freely advance and withdraw to/from the lifting path. Further, the holder 30 provided below the tip end portion of the arm 29 can hold the FOUP 11, and the belt 31 linking the arm 29 and the holder 30 and retractable in the lifting direction can lift up/down the holder 30, between the arm 29 and the FOUP stage 14, when the holder 30 is located opposed to the FOUP stage 14.

Thus, in changing the unprocessed wafer FOUP 11a held by the holder 21 with the processed wafer FOUP 11b mounted on the FOUP stage 14, the unprocessed wafer FOUP 11a can be firstly mounted on the mounting board 27 that has advanced and stood in the lifting path and then the mounting board 27 is permitted to withdraw from the lifting path. As a result, only the processed wafer FOUP 11b can be permitted to present in the lifting path, whereby the holder 21 can be permitted to hold the processed wafer FOUP 11b. Then, by lifting up the holder 21, the processed wafer FOUP 11b can be removed from the FOUP stage 14. Further, the hoist 26 can mount the unprocessed wafer FOUP 11a mounted on the mounting board 27, on the FOUP stage 14.

Also, the processed wafer FOUP 11b can be firstly mounted on the mounting board 27 by the hoist 26, and then the mounting board 27 can be withdrawn from the lifting path. As a result, only the unprocessed wafer FOUP 11a can be permitted to be present in the lifting path, whereby the unprocessed wafer FOUP 11a can be mounted on the FOUP stage 14 by lifting down the holder 21. Further, the mounting board 27 can be permitted to advance and stand in the lifting path to have the holder 21 held the processed wafer FOUP 11b. Then, by lifting up the holder 21, the processed wafer FOUP 11b can be removed from the mounting board 27.

Specifically, the FOUPs 11 (the unprocessed wafer FOUP 11a and the processed wafer FOUP 11b) can be changed without conveying the FOUPs 11 between the substrate processing apparatus 10 and the stocker using the FOUP conveying unit 19. Thus, deterioration in the working rate of the substrate processing apparatus 10 can be prevented. Further, since the deterioration in the working rate of the substrate processing apparatus 10 can be prevented without increasing the number of the FOUP stages 14, the number of the substrate processing apparatuses 10 that can be arranged in the clean room is not required to be reduced. Accordingly, the amount of production of semiconductor devices can be prevented from being reduced.

According to the first FOUP changing method described above, the unprocessed wafer FOUP 11a can be mounted on the mounting board 27 that has advanced and stood in the lifting path, prior to removing the processed wafer FOUP 11b mounted on the FOUP stage 14. Therefore, change of the FOUPs 11 can be started even before completing processing of the wafers to be accommodated in the processed wafer FOUP 11b. In this way, the FOUPs 11 can be changed in an efficient manner.

According to the second FOUP changing method described above, the processed wafer FOUP 11b can be mounted on the mounting board 27 that has advanced and stood in the lifting path, prior to mounting the unprocessed wafer FOUP 11a on the FOUP stage 14. Therefore, change of the containers can be started even when the holder 21 is not located opposed to the FOUP stage 14, or even when the FOUP conveying unit 19 has not conveyed the unprocessed wafer FOUP 11a to the substrate processing apparatus 10. In this way, the FOUPs 11 can be changed in an efficient manner.

In the container changing system 24 described above, only one mounting board 27 has been arranged between the carrier 20 and the FOUP stage 14, with respect to the lifting direction. However a different mounting board may be additionally arranged between the mounting board 27 and the hoist 26 with respect to the lifting direction, while the different mounting board is configured to advance and withdraw to/from the lifting path and mount the FOUP 11 thereon. Thus, the FOUPs 11 can be stocked in the vicinity of the FOUP stage 14 of the substrate processing apparatus 10 by mounting the FOUP 11 on the different mounting board and permitting the different mounting board to withdraw from the lifting path. As a result, the variation in the container changing method in the substrate processing apparatus 10 can be increased. In this way, the FOUPs 11 can be changed in an efficient manner.

In the container changing system 24 described above, the hoist 26 has been moved in the longitudinal direction of the buffer 25 so that the arm 29 and the like will not advance and stand in the lifting direction. Alternative to this, the configuration may be such that the arm 29, the holder 30 and the belt portion 31 are moved in the direction of the main body 28 in the hoist 26, for withdrawal from the lifting path. Thus, in changing the FOUPs, the hoist 26 is not required to be moved in the longitudinal direction of the buffer 25.

Further, in the container changing system 24 described above, it has been the FOUPs 11 that are changed. However, the containers that can be changed in the container changing system to which the present application is applied, are not limited to the FOUPs 11, but BOPs (bottom opening pods) whose bottoms can be opened, may also be changed.

Figure 6A:
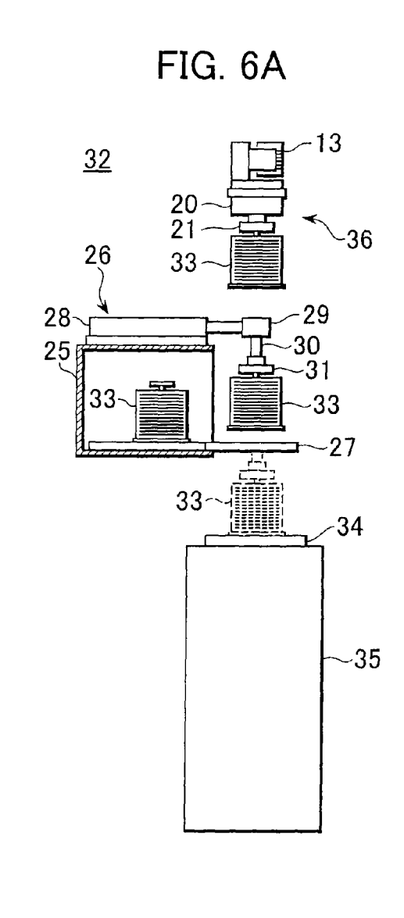
Figure 6B:
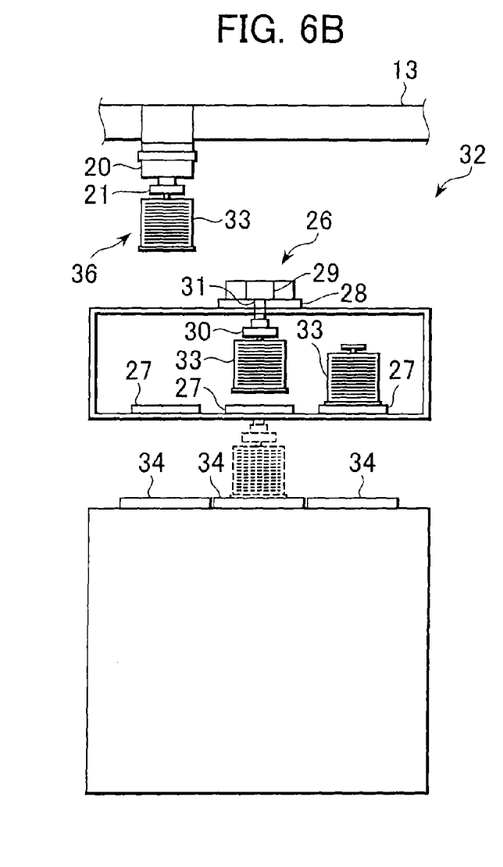

FIGS. 6A and 6B each schematically illustrate a configuration of a container changing system for changing BOPs as containers. FIG. 6A is an illustration as viewed from the side of a loader module of a substrate processing apparatus, and FIG. 6B is an illustration as viewed from the front of the loader module.

In FIGS. 6A and 6B, a container changing system 32 includes: a BOP conveying unit 36 conveying a BOP 33 and having a structure analogous to that of the FOUP conveying unit 19 described above; and a loader module 35 having a top surface on which the BOP 33 can be mounted and a BOP port 34 to which the BOP 33 can be connected. It should be appreciated that the loader module 35 is a component of the substrate processing apparatus.

In the container changing system 32, the rail 13 is laid above the BOP port 34. Also, in the BOP conveying unit 36, the belt 22 lifts up the holder 21 when the holder 21 is located opposed to the BOP port 34. As a result, the BOP 33 hold by the holder 21 is lifted up/down between the carrier 20 and the BOP port 34. Above the loader module 35, the buffer 25 is disposed between the carrier 20 and the BOP port 34 with respect to the lifting direction, without interfering with the lifting path of the BOP 33.

In the container changing system 32 as well, the BOPs 33 can be changed without having the BOP conveying unit 36 conveyed the BOPs 33, between the substrate processing apparatus 10 and the stocker.

What is claimed is:

1. A container changing system comprising:
    a container conveying unit that conveys a container accommodating substrates;
    a substrate processing apparatus that has at least a first mounting portion on which the container is mounted and a loader module;
    a buffer chamber that is disposed on the loader module and has an opening portion and a second mounting portion on which the container is mounted; and
    a container lifting unit that is disposed on said buffer chamber and has a retractable second lifter which lifts up/down the container from the first mounting portion or the second mounting portion;
    wherein
    said container conveying unit comprises:
    a first holder that holds the container so as to lift up/down the container;
    a carrier that supports the first holder and runs along a rail; and
    a first lifter that lifts up/down the container between the carrier and the first mounting portion, when the first holder is located opposed to the first mounting portion,
    wherein
    the second mounting portion freely moves into and out of a lifting path of the container held by the first holder which is lifted up/down by the first lifter, and
    the second mounting portion moves the container mounted thereon between the buffer chamber and the lifting path,
    wherein
    said container lifting unit comprises:
    a base portion that freely moves into and out of the lifting path; and
    a second holder that holds the container and is lifted up/down by the second lifter, and
    wherein
    the second lifter is disposed below the base portion, and lifts up/down the container between said buffer chamber and the second mounting portion or between the second mounting portion and the first mounting portion.

2. A container changing method comprising, changing a first container held by said first holder with a second container mounted on said first mounting portion, in the container changing system according to claim 1, wherein the method comprises:
    a first moving into step of permitting said second mounting portion to move into and stand in the lifting path, when said first holder is located opposed to said first mounting portion;
    a first mounting step of permitting said first lifter to lift down said first holder to mount said first container on said second mounting portion that has moved into and stood in the lifting path;
    a first moving out step of permitting said second mounting portion mounting said first container thereon to move out of the lifting path;
    a first holding step of permitting said first lifter to further lift down said first holder, and permitting said first holder that has been lifted down to hold said second container mounted on said first mounting portion;
    a second moving into step of permitting said second mounting portion to move into and stand in the lifting path, after permitting said first lifter to lift said first holder up to said carrier;
    a second holding step of permitting said base portion to move into and stand in the lifting path, permitting said second lifter to lift down said second holder, and permitting said second holder that has been lifted down to hold said first container mounted on said second mounting portion;
    a second moving out step of permitting said second mounting portion to move out of the lifting path, after permitting said second lifter to lift said first container held by said second holder up to a position causing no interference with a moving out path of said second mounting portion; and
    a second mounting step of permitting said second lifter to lift down said second holder, and permitting said second holder that has been lifted down to mount said first container on said first mounting portion.

3. A container changing method comprising, changing a first container held by said first holder with a second container mounted on said first mounting portion, in the container changing system according to claim 1, wherein the method comprises:

a first holding step of permitting said base portion to move into and stand in the lifting path, permitting said second lifter to lift down said second holder, and permitting said second holder that has been lifted down to hold said second container mounted on said first mounting portion;

a first moving into step of permitting said second mounting portion to move into and stand in the lifting path, after permitting said second lifter to lift a second container held by said second holder up to a position causing no interference with a moving out path of said second mounting portion;

a first mounting step of permitting said second lifter to lift down said second holder to mount said second container on said second mounting portion that has moved into and stood in the lifting path;

a first moving out step of permitting said second mounting portion mounting said second container thereon to move out of the lifting path;

a second mounting step of permitting said first lifter to lift down said first holder to mount said first container on said first mounting portion when said first holder is located opposed to said first mounting portion;

a second moving into step of permitting said second mounting portion to move into and stand in the lifting path, after permitting said first lifter to lift said first holder up to said carrier;

a second holding step of permitting said first lifter to lift down said first holder, and permitting said first holder that has been lifted down to hold said second container mounted on said second mounting portion; and a second moving out step of permitting said first lifter to lift said first holder up to said carrier, and permitting said second mounting portion to move out of the lifting path.

4. A container changing system as claimed in claim 1, wherein the system further comprises a third mounting portion on which the container can be mounted, the third mounting portion being disposed on said buffer chamber.

5. A container changing system as claimed in claim 1, wherein the second mounting portion goes forward and back in one predetermined direction so as to freely move into and out of the lifting path of the container.

6. A container changing system as claimed in claim 1, wherein the container mounted on the second mounting portion is moved out of the lifting path only by moving the second mounting portion into the buffer chamber.

7. A substrate processing system comprising:
at least one processing module that processes substrates;
a transfer module that transfers the substrates into/out of said processing module;
a load-lock module that passes the substrates to said transfer module;
a container that accommodates the substrates; and
a container changing system that transfers the substrates between said container and said load-lock module,
wherein
said container changing system comprises:
a container conveying unit that conveys said container accommodating the substrates;
a loader module that has at least a first mounting portion on which said container is mounted and passes the substrates to said load-lock module;
a buffer chamber that is disposed on the loader module and has an opening portion and a second mounting portion on which said container is mounted; and
a container lifting unit that is disposed on the buffer chamber and has a retractable second lifter which lifts up/down said container from the first mounting portion or the second mounting portion;
wherein
the container conveying unit comprises:
a first holder that holds said container so as to lift up/down said container;
a carrier that supports the first holder and runs along a rail; and
a first lifter that lifts up/down said container between the carrier and the first mounting portion, when the first holder is located opposed to the first mounting portion,
wherein
the second mounting portion freely moves into and out of a lifting path of said container held by the first holder which is lifted up/down by the first lifter, and the second mounting portion moves the container mounted thereon between the buffer chamber and the lifting path,
wherein
the container lifting unit comprises:
a base portion that freely moves into and out of the lifting path; and
a second holder that holds said container and is lifted up/down by the second lifter, and
wherein
the second lifter is disposed below the base portion, and lifts up/down said container between the buffer chamber and the second mounting portion or between the second mounting portion and the first mounting portion.

8. A substrate processing system as claimed in claim 7, wherein said container changing system further comprises a third mounting portion on which said container can be mounted, the third mounting portion being disposed on the buffer chamber.

9. A substrate processing system as claimed in claim 7, wherein the second mounting portion goes forward and back in one predetermined direction so as to freely move into and out of the lifting path of said container.

10. A substrate processing system as claimed in claim 7, wherein the container mounted on the second mounting portion is moved out of the lifting path only by moving the second mounting portion into the buffer chamber.

* * * * *